(12) United States Patent
Suzuki et al.

(10) Patent No.: US 12,341,316 B2
(45) Date of Patent: Jun. 24, 2025

(54) METHOD FOR FORMING FILM ON END-SURFACE OF LASER DIODE BAR

(71) Applicant: Mitsubishi Electric Corporation, Tokyo (JP)

(72) Inventors: Masato Suzuki, Tokyo (JP); Masatsugu Kusunoki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 267 days.

(21) Appl. No.: 18/001,235

(22) PCT Filed: Nov. 12, 2020

(86) PCT No.: PCT/JP2020/042258
§ 371 (c)(1),
(2) Date: Dec. 8, 2022

(87) PCT Pub. No.: WO2022/102052
PCT Pub. Date: May 19, 2022

(65) Prior Publication Data
US 2023/0238772 A1     Jul. 27, 2023

(51) Int. Cl.
*H01S 5/028*     (2006.01)
*H01S 5/40*     (2006.01)

(52) U.S. Cl.
CPC ............ *H01S 5/028* (2013.01); *H01S 5/4025* (2013.01)

(58) Field of Classification Search
CPC ....... H01S 5/4025; H01S 5/4031; H01S 5/028
See application file for complete search history.

(56) References Cited

U.S. PATENT DOCUMENTS

2005/0221549 A1     10/2005  Horie

FOREIGN PATENT DOCUMENTS

| CN | 1681172 A | | 10/2005 |
|---|---|---|---|
| JP | 2000-252580 A | | 9/2000 |
| JP | 2001-077454 A | | 3/2001 |
| JP | 2007-123374 A | | 5/2007 |
| KR | 100290263 | * | 5/2001 |

OTHER PUBLICATIONS

International Search Report issued in PCT/JP2020/042258; mailed Dec. 28, 2020.
An Office Action; mailed by the China National Intellectual Property Administration of the People's Republic of China on Sep. 12, 2024, which corresponds to Chinese Patent Application No. 202080103096.8 and is related to U.S. Appl. No. 18/001,235.

* cited by examiner

*Primary Examiner* — Tabassom Tadayyon Eslami
(74) *Attorney, Agent, or Firm* — Studebaker Brackett PLLC

(57) ABSTRACT

A plurality of laser diode bars and a plurality of dummy bars are alternately arranged on projections provided on an upper surface of a plate so that an opening of the plate is sandwiched between the projections. The plurality of laser diode bars and the plurality of dummy bars are arranged with the projections as reference positions. End surfaces of the plurality of laser diode bars are protruded upward relative to the plurality of dummy bars. Next, an insulation film is formed on protruding portions of the plurality of laser diode bars relative to the plurality of dummy bars.

10 Claims, 4 Drawing Sheets

METHOD FOR FORMING FILM ON END-SURFACE OF LASER DIODE BAR

FIELD

The present disclosure relates to a method for forming a film on an end-surface of a laser diode bar.

BACKGROUND

It is stated in PTL 1 that, for optical semiconductor devices such as laser diodes, it is necessary to provide an end surface coating to obtain a desired reflectivity, and that, with miniaturization of electronic devices, sensitive handling is required, and it is not easy to perform the coating process while maintaining the electronic devices in optimum conditions.

After a semiconductor substrate wafer is divided into laser diode bars, the bars are aligned. First, a technique for dividing a semiconductor substrate wafer into functional device chips includes wafer bonding, dividing, and expanding steps in this order.

In "wafer bonding", the wafer is bonded to an adhesive sheet. This adhesive sheet performs a function of holding chips after dividing. Therefore, an adhesive sheet is selected after studying sheet material contamination on bonded chip surfaces, influence on dividing quality, whether the chips are held and can be easily picked up, etc.

In "dividing", first, if smoothness is not required for the divided cross section, a microcrack is formed in a direction along a scribe line by introducing the scribe line along a desired dividing line on the semiconductor substrate with a diamond tool. Next, stress is applied to the substrate so as to open the macrocrack, thereby developing a crack, and dividing the substrate. By introducing the scribe line so that each of the start point and end point of the scribe line is on a slightly inner side relative to a substrate edge, rather than introducing the scribe line entirely over the desired dividing line, occurrence of chipping during contact of the diamond tool with the substrate edge is suppressed. This scribe method can suppress occurrence of cracks compared to dividing using a rotary blade or laser machining, and is particularly effective when the substrate material is fragile because the divided chips have higher strength. When smoothness is required for the divided cross section like in the case of a laser diode end surface, a microcrack is formed in a direction along a scribe line by introducing the scribe line along a desired dividing line, on one side or both sides of the semiconductor substrate edge, using a diamond tool. Since the semiconductor substrate has a cleavage plane that is easy to separate, the cleavage plane direction and the scribe line need to be parallel. When stress is applied in a direction of opening a micro-scratch made by scribing, the micro-scratch develops along the cleavage plane, and the cleavage plane having atomic-level smoothness is formed.

Consequently, the semiconductor substrate is divided into laser diode bars in the form of bars in which LD chips having the cleavage plane are aligned. The distance between a laser diode bar and adjacent bar held by the adhesive sheet after dividing is small, and, in the case of cleavage dividing, these bars are in contact with each other. In order to pick up each bar in a post-step, it is necessary to expand the distance between the bars, and therefore the following "expanding" is performed.

In "expanding", the adhesive sheet is stretched by pulling. If characteristics of the adhesive sheet used for dividing are not appropriate for the post-step, the expanding process may be performed after bonding the wafer to another sheet for expanding. Here, an example of formation of laser diode bars has been described.

CITATION LIST

Patent Literature

[PTL 1] JP 2007-123374 A

SUMMARY

Technical Problem

For example, in a case in which an insulation film for controlling reflectivity is formed on a cleavage plane of a laser diode end surface, controlling the material of the insulation film wrapping around to the front and back surfaces of the bar improves heat dissipation, and improves device characteristics. For controlling wrapping-around of the insulation film, the stability of a reference surface of a jig on which the bars are arranged is important, in addition to high precision of dummy bar width. However, when the jig becomes worn due to, for example, cleaning, the reference surface of the jig recedes, causing a problem that the relative positions of the laser diode bar and the dummy bar change.

The present disclosure is given to solve the above problem, and aims to provide a method for forming a film on an end-surface of a laser diode bar that can reduce changes in relative positions of the laser diode bar and the dummy bar.

Solution to Problem

A method for forming a film on an end-surface of a laser diode bar according to the present disclosure includes: alternately arranging a plurality of laser diode bars and a plurality of dummy bars on projections provided on an upper surface of a plate so that an opening of the plate is sandwiched between the projections and protruding end surfaces of the plurality of laser diode bars upward relative to the plurality of dummy bars; and forming an insulation film on protruding portions of the plurality of laser diode bars relative to the plurality of dummy bars.

Other features of the present disclosure are revealed below.

Advantageous Effects of Invention

In the present disclosure, the laser diode bars and the dummy bars are placed on the projections or the upper end of the inclined surface. Therefore, changes in the relative positions of the laser diode bars and the dummy bars can be reduced.

DESCRIPTION OF EMBODIMENTS

A method for forming a film on an end-surface of a laser diode bar according to the embodiments of the present disclosure will be described with reference to the drawings. The same components will be denoted by the same symbols, and the repeated description thereof may be omitted.

Embodiment 1

Figure 1:
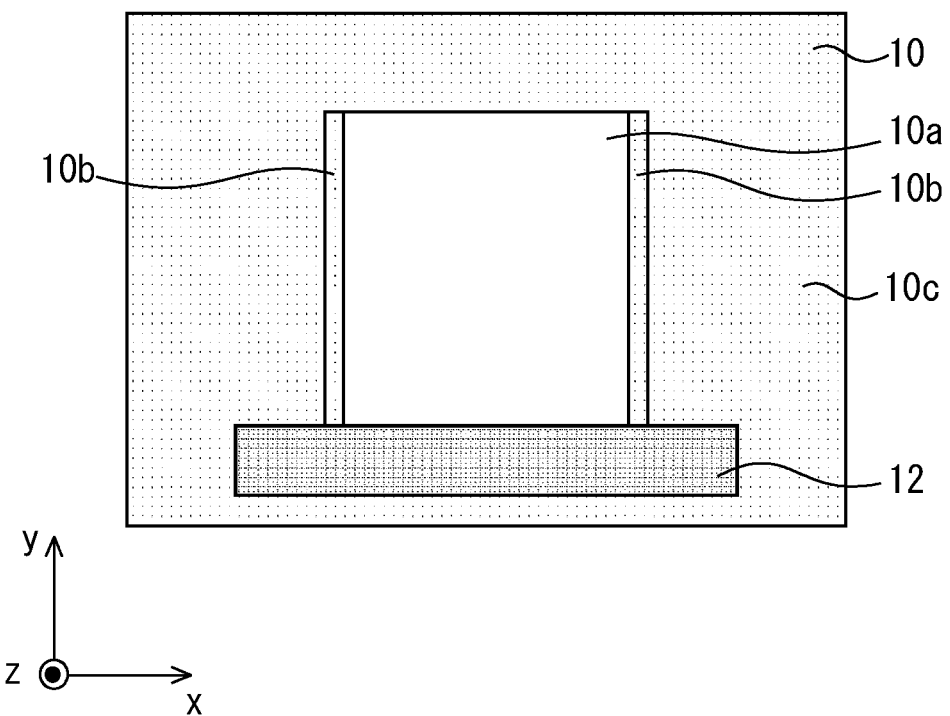
FIG. 1 is a plan view of a plate according to Embodiment 1.

FIG. 1 is a plan view of a plate 10 according to Embodiment 1. In the plate 10, an opening 10a is formed. Projections 10b are provided on an upper surface 10c of the plate 10 so that the opening 10a is sandwiched between the projections 10b. Each projection 10b is a portion extending higher than the upper surface 10c in a positive z direction. According to one example, the projections 10b are provided linearly, on the left and right sides of the opening 10a of the plate 10 in the plan view. According to another example, the projections are provided along the opening 10a, at positions spaced apart from the opening 10a by a fixed distance. A stopper 12 is secured to the plate 10, and prevents a laser diode bar and a dummy bar placed on the projections 10b from falling down in a negative y direction.

Figure 2:
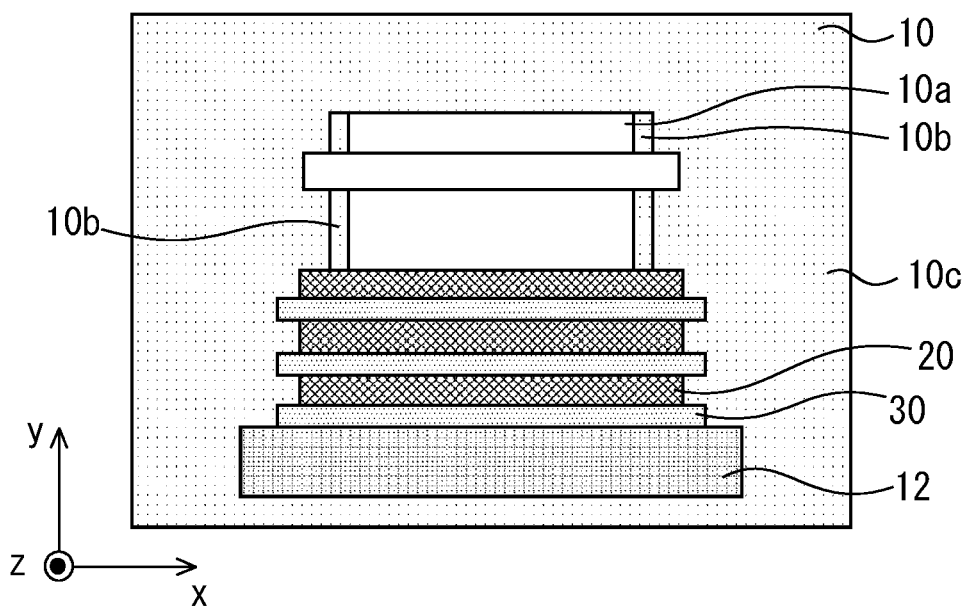
FIG. 2 shows that laser diode bars and dummy bars are aligned.

In a method for forming a film on an end-surface of a laser diode bar according to Embodiment 1, first, a plurality of laser diode bars and a plurality of dummy bars are alternately arranged on the projections 10b. According to one example, after each bar is separated from an adhesive sheet by pushing the bar up with a needle through the adhesive sheet, the bar is transported onto a jig for alignment of bars using tweezers, or an adsorption collet or the like. This process is called "bar pickup". Thereafter, as shown in FIG. 2, laser diode bars 20 and dummy bars 30 are aligned on the projections 10b. The material of the laser diode bars 20 is, for example, a compound semiconductor. According to one example, functional devices are formed in a regular pattern on the front surface of the laser diode bars 20 by grooving, or stacking a layer of different material, in a pre-step.

Figure 3:
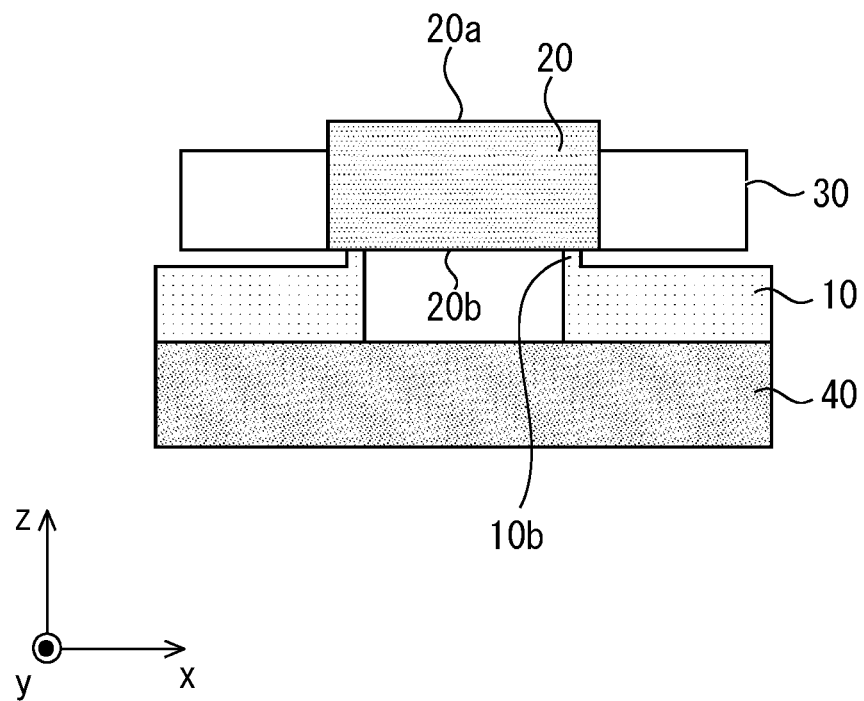
FIG. 3 is a cross-sectional view of a configuration before deposition.

FIG. 3 is a view showing that the laser diode bar 20 and the dummy bar 30 are placed on the projections 10b. For the sake of convenience of explanation, only the outline of the dummy bar 30 is illustrated. The plate 10 is mounted on a lower jig 40. When the laser diode bar 20 and the dummy bar 30 are arranged on the projections 10b, an end surface 20a of the laser diode bar 20 protrudes upward relative to the dummy bar 30. Further, as shown in FIG. 3, an end surface 20b of the laser diode bar 20 and a bottom surface of the dummy bar 30 contact the projections 10b, and are therefore at the same height. According to one example, the end surface 20a is a front end surface, and the end surface 20b is a rear end surface. Furthermore, it is clear from FIG. 3 that a plurality of dummy bars 30 are longer in a lateral direction than a plurality of laser diode bars 20.

Figure 4:
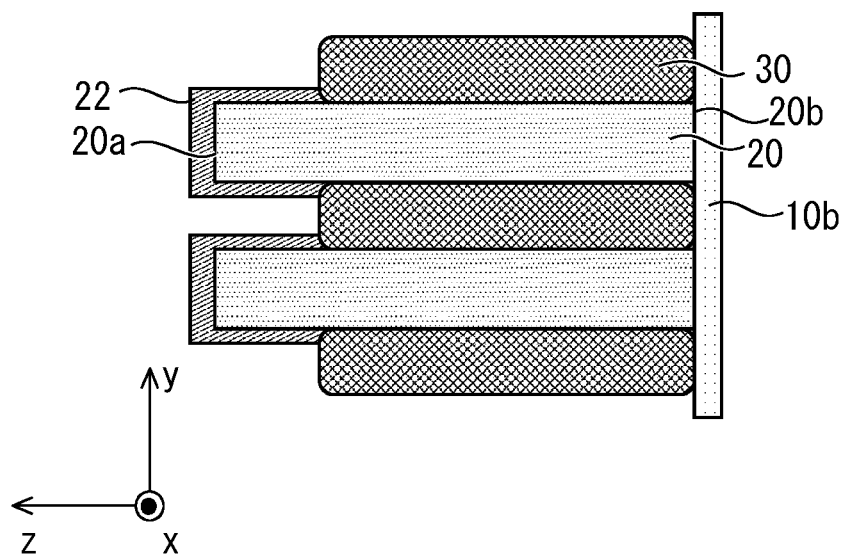
FIG. 4 is a side view of the laser diode bars and the dummy bars after deposition.

FIG. 4 is a view showing the heights of the laser diode bars 20 and the dummy bars 30. When the plurality of laser diode bars 20 and the plurality of dummy bars 30 are alternately arranged on the projections 10b, the end surfaces 20a of the plurality of laser diode bars 20 protrude upward relative to the plurality of dummy bars 30. As shown in FIG. 4, the end surfaces 20b of the plurality of laser diode bars 20 and the bottom surfaces of the plurality of dummy bars 30 contact the projections 10b, and are therefore at the same height. Thus, the plurality of laser diode bars 20 and the plurality of dummy bars 30 are aligned on the projections 10b.

Next, an insulation film is formed on the protruding portions of the plurality of laser diode bars 20 relative to the plurality of dummy bars 30. The insulation film is formed, for example, to control the reflectivity of the laser diodes. It is shown in FIG. 4 that an insulation film 22 is formed on the end surface 20a, and front and back surfaces of each laser diode bar 20.

Figure 5:
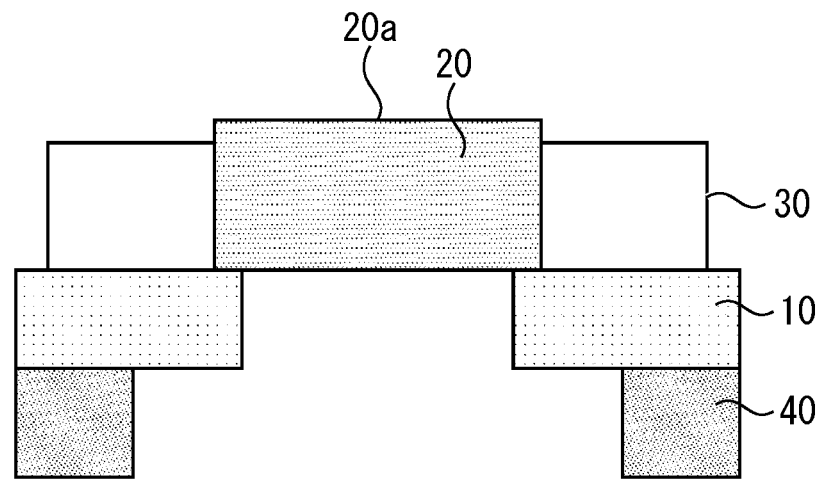
FIG. 5 is a view showing a method for forming a film on an end-surface of a laser diode bar according to a comparative example.
Figure 6:
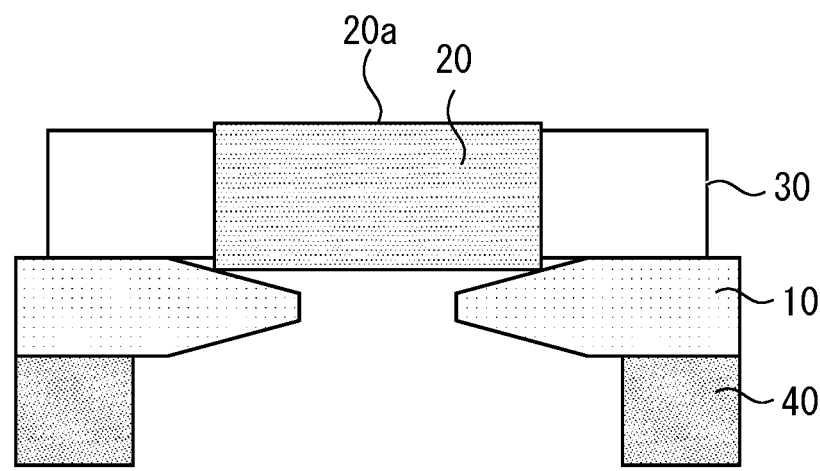
FIG. 6 is a view showing a method for forming a film on an end-surface of a laser diode bar according to a comparative example.
Figure 7:
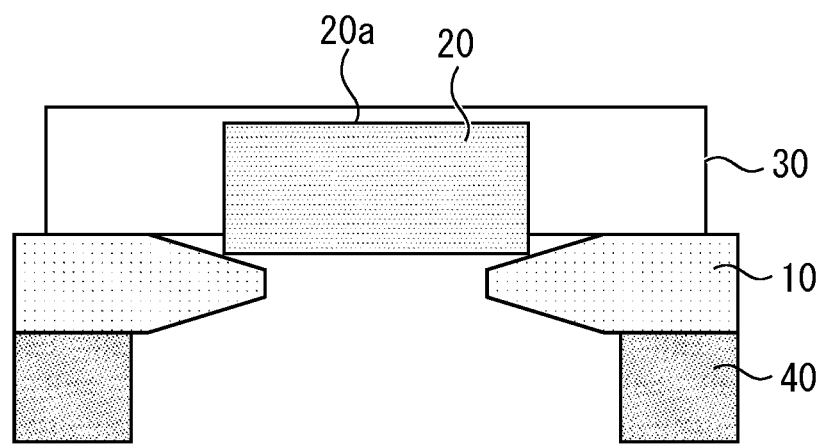
FIG. 7 is a view showing a method for forming a film on an end-surface of a laser diode bar according to a comparative example.

FIGS. 5 to 7 are views showing a method for forming a film on an end-surface of a laser diode bar according to a comparative example. It is shown in FIG. 5 that the laser diode bar 20 and the dummy bar 30 are placed on the upper surface of the plate 10. If the laser diode bar 20 and the dummy bar 30 are placed on a flat surface of the plate 10 in such a manner, the flat surface becomes worn as the plate is used a number of times. FIGS. 6 and 7 are views showing the worn plate 10. When the upper surface of the plate 10 becomes worn, the position of the laser diode bar 20 which is shorter in the lateral direction is lowered, whereas the position of the dummy bar 30 which is longer in the lateral direction does not change much. Consequently, the relative positions of the laser diode bar 20 and the dummy bar 30 deviate. As shown in FIG. 7, when the wear of the upper surface of the plate 10 progresses, and the position of the end surface 20a of the laser diode bar 20 becomes lower than the upper end of the dummy bar 30, the insulation film 22 shown in FIG. 4 cannot be formed.

On the other hand, in Embodiment 1, since the plurality of laser diode bars 20 and dummy bars 30 are placed on the projections 10b, the reference positions of all the bars are the projections 10b. Since the projections 10b serve as the reference positions of the bars, even when the wear of the plate 10 progresses, the reference is guaranteed as long as the projections 10b exist. Therefore, changes in the relative positions of the laser diode bars 20 and the dummy bars 30 can be reduced. Note that, in order to improve wear resistance, it is possible to change the projection shape to a rounded shape from the rectangle, or adjust the length of the projection in the x direction.

The variations, modifications or alternatives described in Embodiment 1 are applicable to a method for forming a film on an end-surface of a laser diode bar according to the following embodiment. For the method for forming a film on an end-surface of a laser diode bar according to the following embodiment, the differences from Embodiment 1 will mainly be described.

Embodiment 2

Figure 8:
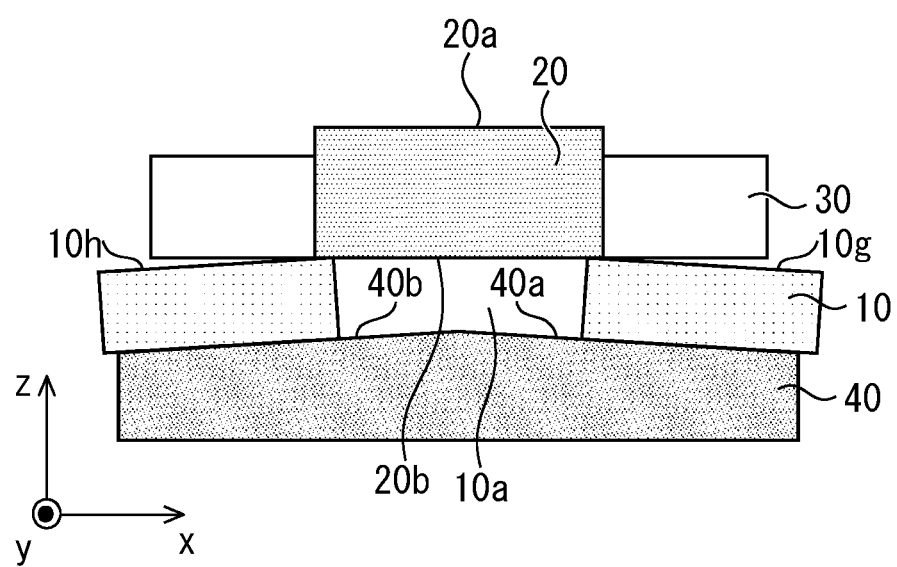
FIG. 8 is a cross-sectional view of a plate or the like according to Embodiment 2.

FIG. 8 shows the plate 10 and the lower jig 40 for use in the method for forming a film on an end-surface of a laser diode bar according to Embodiment 2. The upper surface of the plate 10 includes inclined surfaces 10g, 10h with height increasing toward the opening 10a. Each of the inclined surfaces 10g, 10h is a surface extending in a positive Y direction. According to one example, the plate 10 is two pieces of plate material placed on the lower jig 40 having inclined surfaces 40a, 40b. For example, the two pieces of plate material can be secured to the lower jig 40 by an arbitrary method. In this example, the thickness of the plate 10 is uniform, and the plate 10 is placed on the inclined surfaces 40a, 40b, and consequently the plate 10 is provided with the inclined surfaces 10g, 10h. According to another example, the upper surface of the lower jig 40 may be made a flat surface instead of the inclined surface. In this case, the inclined surfaces 10g, 10h are provided by forming the plate 10 with thickness increasing toward the opening 10a.

In the method for forming a film on an end-surface of a laser diode bar according to Embodiment 2, a plurality of laser diode bars 20 and a plurality of dummy bars 30 are alternately arranged on highest portions of the inclined surfaces 10g, 10h. As a result, the end surfaces 20a of the plurality of laser diode bars 20 protrude upward relative to the plurality of dummy bars 30. Moreover, the end surfaces 20b of the plurality of laser diode bars 20 and the lower ends of the plurality of dummy bars 30 contact the highest portions of the inclined surfaces 10g, 10h.

Next, an insulation film is formed on the protruding portions of the plurality of laser diode bars 20 relative to the plurality of dummy bars 30. Thus, the insulation film 22 shown in FIG. 4 is formed. In the present embodiment, the highest edge portions of the plate 10 serve as the reference positions of the plurality of laser diode bars 20 and the plurality of dummy bars 30. Since the edge portions continue to serve as the reference positions even when the wear of the plate 10 progresses, it is possible to reduce changes in the relative positions of the laser diode bars and the dummy bars. Note that the inclination angles of the inclined surfaces 10g, 10h can be adjusted to make the edge portions last longer against wear.

REFERENCE SIGNS LIST 10 plate; 10a opening; 10b projection; upper surface 10c; 20 laser diode bar; 30 dummy bar; 10g, 10h inclined surface

The invention claimed is:

1. A method for forming a film on an end-surface of a laser diode bar comprising:
   alternately arranging a plurality of laser diode bars and a plurality of dummy bars on projections projecting from an upper surface of a plate in an upward direction from the upper surface so that an opening of the plate is sandwiched between the projections in a lateral direction along the upper surface, and end surfaces of the plurality of laser diode bars protrude upward relative to the plurality of dummy bars; and
   forming an insulation film on protruding portions of the end surfaces of the plurality of laser diode bars relative to the plurality of dummy bars.

2. The method for forming a film on an end-surface of a laser diode bar according to claim 1, wherein the projections are provided linearly on left and right sides of the opening of the plate in plan view.

3. The method for forming a film on an end-surface of a laser diode bar according to claim 2, wherein the plurality of dummy bars are longer in a lateral direction than the plurality of laser diode bars.

4. The method for forming a film on an end-surface of a laser diode bar according to claim 1, wherein the plurality of dummy bars are longer in a lateral direction than the plurality of laser diode bars.

5. The method for forming a film on an end-surface of a laser diode bar according to claim 1, wherein the plurality of laser diode bars and the plurality of dummy bars are provided on top of the projections in the upward direction.

6. A method for forming a film on an end-surface of a laser diode bar comprising:
   alternately arranging a plurality of laser diode bars and a plurality of dummy bars on highest portions of inclined surfaces of an upper surface of a plate, and end surfaces of the plurality of laser diode bars protrude upward relative to the plurality of dummy bars; and
   forming an insulation film on protruding portions of the end surfaces of the plurality of laser diode bars relative to the plurality of dummy bars,
   wherein the plate has an opening and the inclined surfaces are inclined upward toward a center of the opening.

7. The method for forming a film on an end-surface of a laser diode bar according to claim 6, wherein the inclined surfaces respectively have lower portions that are farther from the center of the opening in a lateral direction compared to distances from the highest portions to the center of the opening in the lateral direction.

8. The method for forming a film on an end-surface of a laser diode bar according to claim 6, wherein the plate includes two pieces of plate material placed on a lower jig having inclined surfaces.

9. The method for forming a film on an end-surface of a laser diode bar according to claim 6, wherein the plurality of dummy bars are longer in a lateral direction than the plurality of laser diode bars.

10. The method for forming a film on an end-surface of a laser diode bar according to claim 8, wherein the plurality of dummy bars are longer in a lateral direction than the plurality of laser diode bars.

* * * * *